(12) United States Patent
Kim et al.

(10) Patent No.: US 12,035,610 B2
(45) Date of Patent: Jul. 9, 2024

(54) FOLDABLE DISPLAY DEVICE

(71) Applicant: Samsung Display Co., LTD., Yongin-si (KR)

(72) Inventors: Jinhyoung Kim, Seoul (KR); Changmin Park, Gwangmyeong-si (KR); Jaechun Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 340 days.

(21) Appl. No.: 17/493,340

(22) Filed: Oct. 4, 2021

(65) Prior Publication Data

US 2022/0216436 A1  Jul. 7, 2022

(30) Foreign Application Priority Data

Jan. 4, 2021 (KR) .................. 10-2021-0000537

(51) Int. Cl.
*H10K 77/10* (2023.01)
*B32B 3/30* (2006.01)
*B32B 7/022* (2019.01)
*H10K 59/12* (2023.01)
*H10K 102/00* (2023.01)

(52) U.S. Cl.
CPC ............ *H10K 77/111* (2023.02); *B32B 3/30* (2013.01); *B32B 7/022* (2019.01); *H10K 59/12* (2023.02); *B32B 2307/546* (2013.01); *B32B 2457/20* (2013.01); *H10K 2102/311* (2023.02)

(58) Field of Classification Search
CPC .............. H10K 77/111; H10K 59/12; H10K 2102/311; H10K 50/84; B32B 3/30; B32B 7/022; B32B 2307/546; B32B 2457/20; G06F 1/1641; G06F 1/1652; G09F 9/301
See application file for complete search history.

(56) References Cited

U.S. PATENT DOCUMENTS 9,964,995 B1  5/2018  Morrison et al.
2016/0357052 A1*  12/2016  Kim .................. H10K 50/84
(Continued)

FOREIGN PATENT DOCUMENTS

CN  111445796  7/2020
EP  2 811 365  12/2014
(Continued)

OTHER PUBLICATIONS

Extended European search report for European Patent Application or Patent No. 21218458.4 dated May 18, 2022.

*Primary Examiner* — Joe E. Schoenholtz
(74) *Attorney, Agent, or Firm* — KILE PARK REED & HOUTTEMAN PLLC

(57) ABSTRACT

A foldable display device includes a flexible display module and a first plate. The flexible display module includes a foldable area and the non-foldable area. The foldable area includes a first area, a second area spaced apart from the first area and disposed in at least two sides of the first area, and a third area disposed between the first area and the second area. The non-foldable area is disposed in at least two sides of the foldable area. The first plate is disposed under the flexible display module. The first plate includes a plurality of grooves overlapping the second area and penetrating the first plate. The first plate overlapping the third area does not include grooves.

21 Claims, 18 Drawing Sheets

(56) References Cited

U.S. PATENT DOCUMENTS

2020/0245477 A1 7/2020 Park et al.
2022/0019265 A1 1/2022 Kee et al.

FOREIGN PATENT DOCUMENTS

| EP | 3 477 424 | 5/2019 | | |
|---|---|---|---|---|
| EP | 3477424 A1 | * | 5/2019 | ........... G06F 1/1652 |
| KR | 10-2016-0144912 | 12/2016 | | |

* cited by examiner

FOLDABLE DISPLAY DEVICE

CROSS-REFERENCE TO RELATED APPLICATION(S)

This application claims priority to and the benefit of Korean Patent Application No. 10-2021-0000537 under 35 U.S.C. § 119, filed on Jan. 4, 2021, the entire contents of which are incorporated herein by reference.

BACKGROUND

1. Technical Field

Embodiments described herein relate to a display device. Specifically, embodiments described herein relate to a foldable display device capable of folding and unfolding.

2. Description of the Related Art

A display device may provide user with information by displaying an image. Unlike a flat panel display device, in a flexible display device, a part of the flexible display device may be bent. Also, the flexible display device can display an image even in a bent portion. The flexible display device is easy to carry and can improve user convenience.

Recently, among the flexible display devices, a foldable display device has attracted attention. The foldable display device may be repeatedly folded or unfolded. When the foldable display device is repeatedly folded or unfolded, repulsive force may be generated in the foldable display device. Accordingly, a crease may occur in the foldable display device, and when crease is recognized by user, a display performance of the foldable display device may be degraded.

SUMMARY

Embodiments provide a foldable display device capable of reducing repulsive force during folding and unfolding.

A foldable display device according to embodiments may include a flexible display module and a first plate disposed under the flexible display module. The flexible display module may include a foldable area and non-foldable area disposed in at least two sides of the foldable area. The foldable area may include a first area, a second area spaced apart from the first area and disposed in at least two sides of the first area, and a second area disposed between the first area and the second area. The first plate may include a plurality of grooves overlapping the second area and penetrating the first plate. The first plate overlapping the third area may not include grooves.

In an embodiment, in case that the flexible display module is folded, the flexible display module may have a first curvature radius in the first area, and may have a second curvature radius in the second area. The second curvature radius may be greater than the first curvature radius.

In an embodiment, in case that the flexible display module is folded, a curvature center of the flexible display module in the second area may be disposed on a non-display surface of the flexible display module, and a curvature center of the flexible display module in the first area may be disposed on a display surface of the flexible display module.

In an embodiment, the foldable display device may further include a protection layer disposed under the first plate and overlapping the second area.

In an embodiment, the foldable display device may further include a second plate disposed under the first plate and overlapping each of the non-foldable area and the third area.

In an embodiment, a rigidity of the second plate may be greater than a rigidity of the first plate.

A foldable display device according to embodiments may include a flexible display module and a first plate disposed under the flexible display module. The flexible display module may include a foldable area and non-foldable area disposed in at least two sides of the foldable area. The foldable area may include a first area, a second area spaced apart from the first area and disposed in at least two sides of the first area, and a second area disposed between the first area and the second area. The first plate may include a plurality of grooves overlapping the second area and not penetrating the first plate. The first plate overlapping the third area may not include grooves.

In an embodiment, in case that the foldable display device is folded, the flexible display module may have a first curvature radius in the first area and may have a second curvature radius in the second area. The second curvature radius may be greater than the first curvature radius.

In an embodiment, a thickness of each of the plurality of grooves not penetrating the first plate compared to a thickness of the first plate may be about 40% or greater and about 60% or less.

In an embodiment, the foldable display device may further include a second plate disposed under the first plate and overlapping each of the non-foldable area and the third area.

In an embodiment, a rigidity of the second plate may be greater than a rigidity of the first plate.

A foldable display device according to embodiments may include a flexible display module and a first plate disposed under the flexible display module. The flexible display module may include a foldable area and non-foldable area disposed in at least two sides of the foldable area. The foldable area may include a first area, a second area spaced apart from the first area and disposed in at least two sides of the first area, and a second area disposed between the first area and the second area. A thickness of the first plate overlapping the second area may be less than a thickness of the first plate overlapping the non-foldable area. The first plate overlapping the third area may not include grooves.

In an embodiment, in case that the flexible display module is folded, the flexible display module may have a first curvature radius in the first area, and may have a second curvature radius in the second area. The second curvature radius may be greater than the first curvature radius.

In an embodiment, the thickness of the first plate overlapping the second area compared to the thickness of the first plate overlapping the non-foldable area may be about 50% or greater.

In an embodiment, the first plate may further include a plurality of grooves overlapping the second are and penetrating the first plate.

In an embodiment, the foldable display device may further include a protection layer disposed under the first plate and overlapping the second area.

In an embodiment, the first plate may further include a plurality of grooves overlapping the second area and not penetrating the first plate.

In an embodiment, a thickness of each of the plurality of grooves not penetrating the first plate compared to the thickness of the first plate overlapping the second area may be about 40% or greater and about 60% or less.

In an embodiment, a thickness of each of the plurality of grooves not penetrating the first plate compared to the thickness of the first plate overlapping the second area may be about 40% or greater and about 60% or less.

In an embodiment, the foldable display device may further include a second plate disposed under the first plate and overlapping each of the non-foldable area and the third area.

In an embodiment, a rigidity of the second plate may be greater than a rigidity of the first plate.

The foldable display device according to embodiments may include a first plate including a plurality of grooves. Accordingly, repulsive force of the first plate may be relatively reduced, and crease generated when the foldable display device is folded or unfolded may not occur.

In the foldable display device according to embodiments, a thickness of a first plate overlapping a second area may be smaller than a thickness of the first plate overlapping a non-foldable area. Accordingly, repulsive force of the first plate may be relatively reduced, and crease generated when the foldable display device is folded or unfolded may not occur.

BRIEF DESCRIPTION OF THE DRAWINGS

The accompanying drawings, which are included to provide a further understanding of the disclosure and are incorporated in and constitute a part of this specification, illustrate illustrative embodiments of the disclosure, and together with the description serve to explain the disclosure.

DETAILED DESCRIPTION OF THE EMBODIMENTS

Hereinafter, embodiments of the disclosure will be explained in detail with reference to the accompanying drawings.

The phrase "at least one of" is intended to include the meaning of "at least one selected from the group of" for the purpose of its meaning and interpretation. For example, "at least one of A and B" may be understood to mean "A, B, or A and B." The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
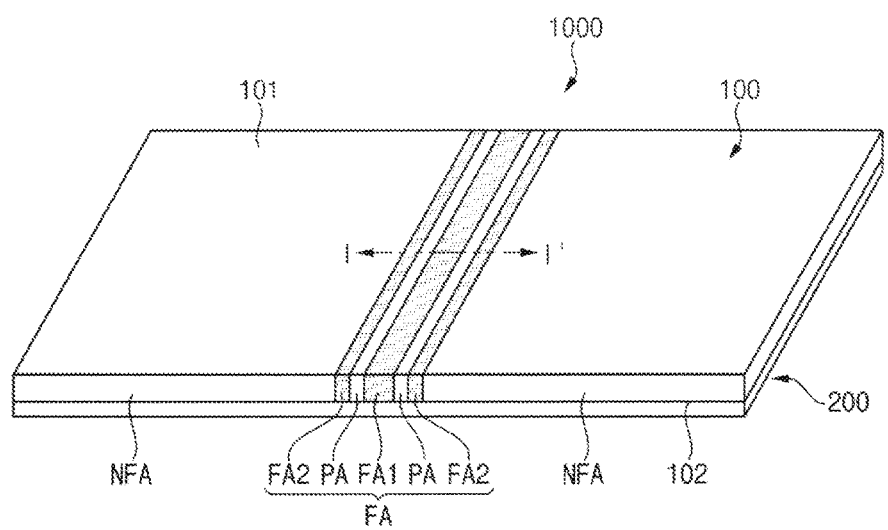
FIG. 1 is a perspective view schematically illustrating an unfolded state of a foldable display device according to an embodiment of the disclosure.
Figure 2:
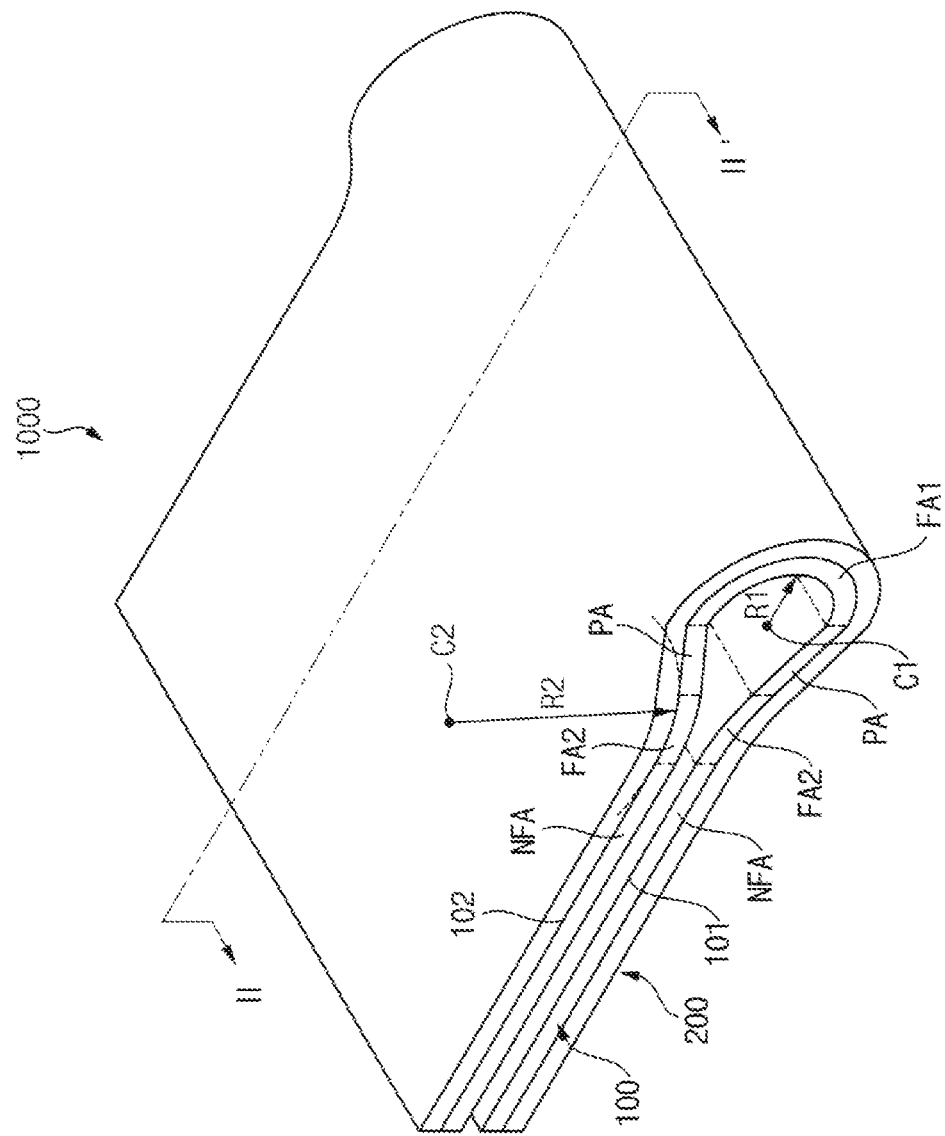
FIG. 2 is a perspective view schematically illustrating a folded state of the foldable display device of FIG. 1.

FIG. 1 is a perspective view schematically illustrating an unfolded state of a foldable display device according to an embodiment of the disclosure. FIG. 2 is a perspective view schematically illustrating a folded state of the foldable display device of FIG. 1.

Referring to FIG. 1 and FIG. 2, a foldable display device 1000 according to an embodiment of the disclosure may include a flexible display module 100 and a first plate 200.

Although not shown in FIG. 1 and FIG. 2, the foldable display device may further include a case covering the flexible display module 100 and the first plate 200, hinge, etc.

The flexible display module 100 may include a display surface 101 and a non-display surface 102 opposed to the display surface 101. The flexible display module 100 may display an image in direction of the display surface 101. The non-display surface 102 may not display an image.

The flexible display module 100 may include a flexible substrate made of flexible plastic instead of a rigid substrate made of rigid glass. Accordingly, the flexible display module 100 may be freely folded or unfolded within a predetermined range.

The first plate 200 may be disposed under the flexible display module 100. A rigidity of the first plate 200 may be greater than the flexible display module 100, so the first plate 200 may support the flexible display module 100. For example, the first plate 200 may prevent deformation of the flexible display module 100 due to touch of users. The first plate 200 may include nobinite, stainless steel, invar, or an alloy thereof. A thickness of the first plate 200 may be about 130 μm or greater and about 170 μm or less. The thickness of the first plate 200 may be about 150 μm.

The flexible display module 100 may include a foldable area FA, and a non-foldable area NFA positioned in at least two sides or both sides of the foldable area FA. The foldable area FA may include a first area FA1, a second area FA2 positioned apart from the first area FA1 and positioned in both sides of the first area FA1, and a third area PA positioned between the first area FA1 and the second area FA2.

In case that the flexible display module 100 is folded, the flexible display module 100 may have a curved surface in the first area FA1. For example, in case that the flexible display module 100 is folded, the flexible display module 100 may have a first curvature radius R1 in the first area FA1. Also, in case that the flexible display module 100 is folded, a curvature center of the flexible display module 100 in the first area FA1 may be a first curvature center C1. The first curvature center C1 may be disposed on the display surface 101 of the flexible display module 100. In other words, the first curvature center C1 may be adjacent to the display surface 101 of the flexible display module 100, and a shortest distance between the first curvature center C1 and the display surface 101 of the flexible display module 100 may be less than a shortest distance between the first curvature center C1 and the non-display surface 102 of the flexible display module 100.

In case that the flexible display module 100 is folded, the flexible display module 100 may have a curved surface in the second area FA2. For example, in case that the flexible display module 100 is folded, the flexible display module 100 may have a second curvature radius R2 in the second area FA2. The second curvature radius R2 may be greater than the first curvature radius R1, or the second curvature radius R2 may be substantially equal to the first curvature radius R1. In case that the flexible display module 100 is folded, a curvature center of the flexible display module 100 in the second area FA2 may be a second curvature center C2. The second curvature center C2 may be disposed on the non-display surface 102 of the flexible display module 100. In other words, the second curvature center C2 may be adjacent to the non-display surface 102 of the flexible display module 100, and a shortest distance between the second curvature center C2 and the non-display surface 102 of the flexible display module 100 may be greater than a shortest distance between the second curvature center C2 and the display surface 101 of the flexible display module 100.

In case that the flexible display module 100 is folded, the flexible display module 100 may have a substantially flat surface in the non-foldable area NFA.

In case that the flexible display module 100 is folded, the flexible display module 100 may have a substantially flat surface in the second area FA2. However, the disclosure is not limited thereto, and in case that the flexible display module 100 is folded, the flexible display module 100 may have a curved surface in the third area PA.

In an embodiment, the foldable display device 1000 may include a support element attached under the first plate 200 overlapping the third area PA. A rigidity of the support element may be relatively large. The support element may support the first plate 200 overlapping the third area PA.

In an embodiment, the support element may be further attached under the first plate 200 overlapping the non-foldable area NFA. The support element may be connected to the case, the hinge, etc. The support element may support the first plate 200 overlapping the non-foldable area NFA.

In case that the foldable display device 1000 is folded and then unfolded, repulsive force may be generated in the first plate 200 overlapping the foldable area FA. For example, in case that the foldable display device 1000 is folded and then unfolded, repulsive force may be generated in the first plate 200 overlapping each of the second area FA2 and the first area FA1.

In the disclosure, the second curvature radius R2 may be greater than the first curvature radius, so repulsive force of the first plate 200 overlapping the first area FA1 may be greater than repulsive force of the first plate 200 overlapping the second area FA2.

In case that repulsive force is generated in the first plate 200, a crease may occur in the foldable display device 1000. For example, in case that the foldable display device is folded and then unfolded, the crease may occur in each of the first area FA1 and the second area FA2.

In the disclosure, in case that the flexible display module 100 is folded, the first curvature center C1 may be disposed on the display surface 101 of the flexible display module 100, and the second curvature center C2 may be disposed on the non-display surface 102 of the flexible display module 100. Accordingly, a depth of the crease in the second area FA2 may be greater than a depth of the crease in the first area FA1.

In order to reduce repulsive force of the first plate 200, a groove (for example, a groove 210 of FIG. 6) may be formed in the first plate 200. In case that the groove is formed in the first plate 200, a flexible characteristic of the first plate 200 may increase, so repulsive force may decrease.

In order to reduce repulsive force of the first plate 200, a thickness of the first plate 200 overlapping the foldable area FA may be less than a thickness of the first plate 200 overlapping the non-foldable area NFA. In this case, a thickness of the first plate 200 overlapping the third area PA may be substantially equal to a thickness of the first plate 200 overlapping the non-foldable area NFA. As the thickness of the first plate 200 decreases, the flexible characteristic of the first plate 200 may increase, so repulsive force of the first plate 200 may decrease. As the thickness of the first plate 200 increases, the rigidity of the first plate 200 may increase.

In order to reduce a generation of the crease in the first plate 200, the support element may be attached under the first plate 200 overlapping the third area PA. The rigidity of the support element may be relatively large. Accordingly, the support element may suppress occurrence of the crease due to deformation of the first plate 200 overlapping the third area PA. Since the support element may be attached under the first plate 200 overlapping the third area PA, the groove may not be formed in the first plate 200 overlapping the third area PA.

Figure 3:
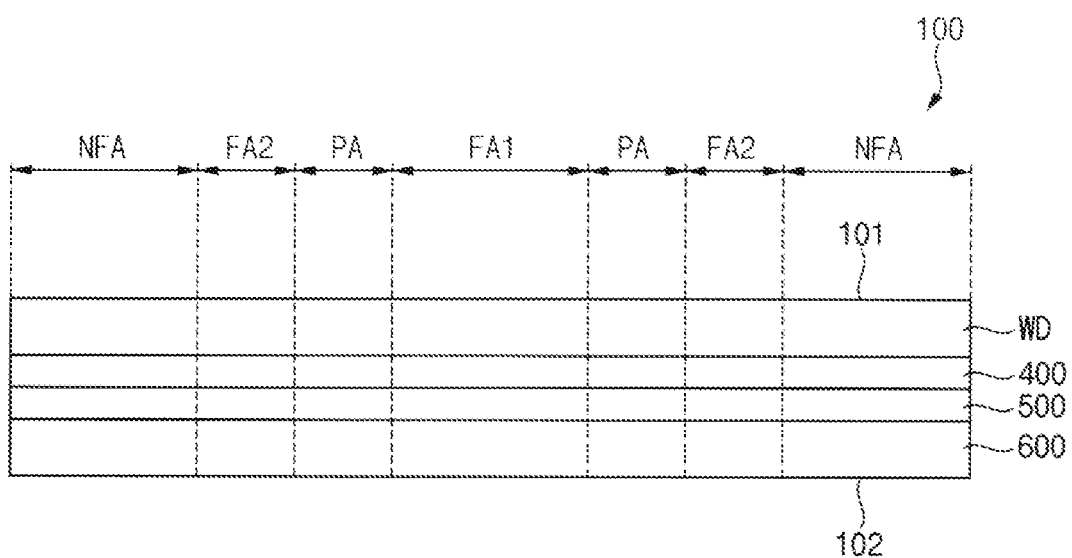
FIG. 3 is a cross-sectional view schematically illustrating a flexible display module included in the foldable display device of FIG. 1.

FIG. 3 is a cross-sectional view schematically illustrating a flexible display module included in the foldable display device of FIG. 1.

Referring to FIG. 3, a flexible display module 100 may include a window WD, a polarizing layer 400, a sensing layer 500, and a display panel 600. As described above, since the flexible display module 100 may be folded or unfolded, each of the window WD, the polarizing layer 400, the sensing layer 500, and the display panel 600 may have flexible characteristics.

The window WD may protect the polarizing layer 400, the sensing layer 500, and the display panel 600 from external impact. In an embodiment, the window WD may include a glass, or a polymer resin such as a polycarbonate, polymethyl methacrylate, polyacrylate, polyethersulfone, polyethylene terephthalate, polyethylene naphthalate.

The polarizing layer 400 may be disposed under the window WD. The polarizing layer 400 may reduce reflection of external light from the display device 1000. For example, in case that external light passes through the polarizing layer 400 and is reflected from a lower portion of the polarizing layer 400 (for example, the display panel 600) and then passes through the polarizing layer 400 again, the polarizing layer 400 may change a phase of the external light. Accordingly, since a phase of a reflected light is different from a phase of the incident light entering the polarizing layer 400, extinction interference may occur, and reflection of external light may be reduced, thereby improving visibility of the foldable display device 1000.

The sensing layer 500 may be disposed under the polarizing layer 400. The sensing layer 500 may detect an external input, such as in case that an external object contacts or approaches the foldable display device 1000. For example, the sensing layer 500 may sense the external input in a capacitive manner. Optionally, the sensing layer 500 may be disposed on the polarizing layer 400.

The display panel 600 may be disposed under the sensing layer 500. The display panel 600 may include pixels, and may generate an image in which light emitted from each of the pixels is combined. The display panel 600 may include a first surface and a second surface opposite to each other. The display panel 600 may display an image on the first surface, and the second surface of the display panel 600 may correspond to the non-display surface 102 of the flexible display module 100.

Figure 4:
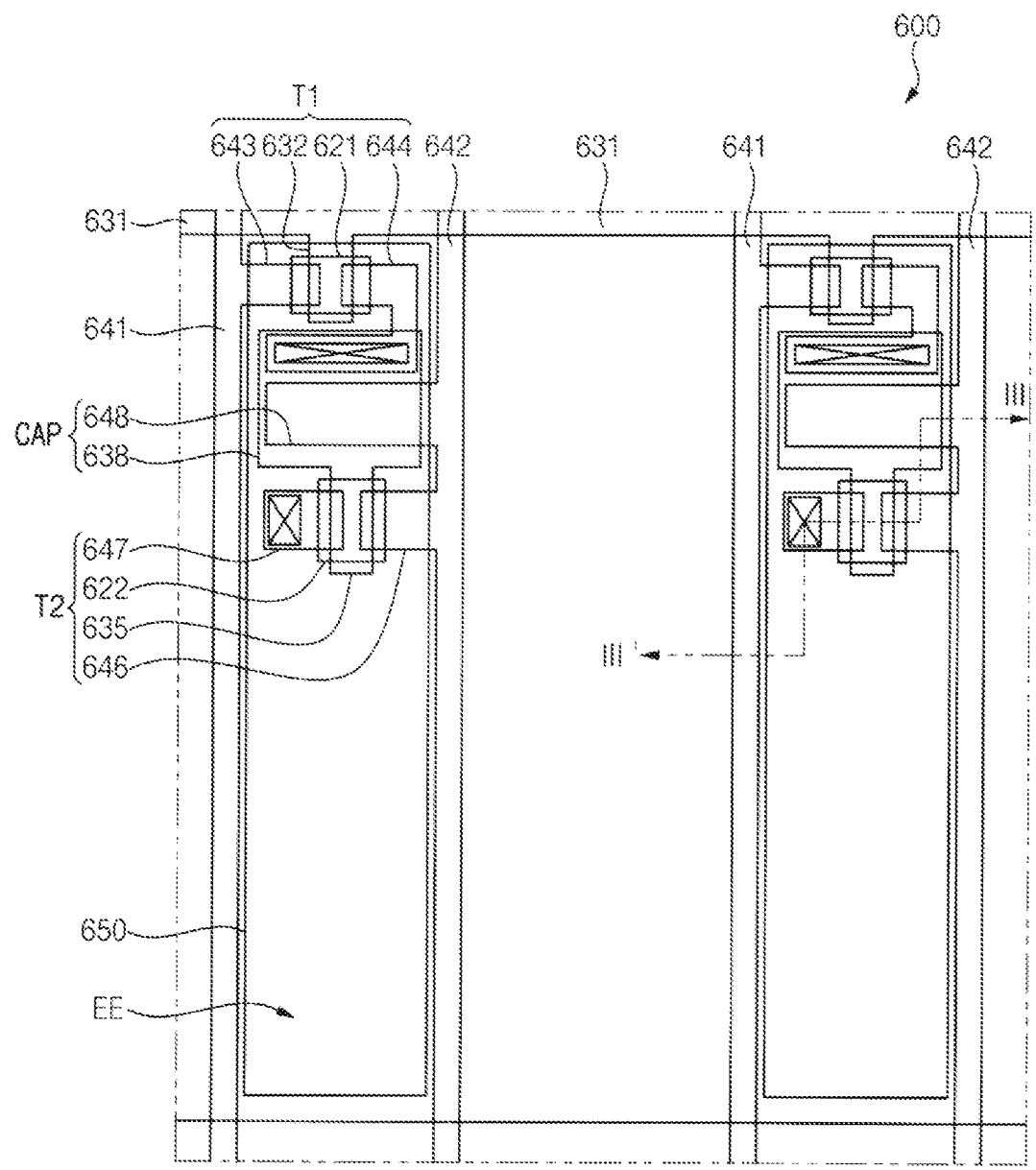
FIG. 4 is a plan view schematically illustrating a display panel included in the flexible display module of FIG. 3.
Figure 5:
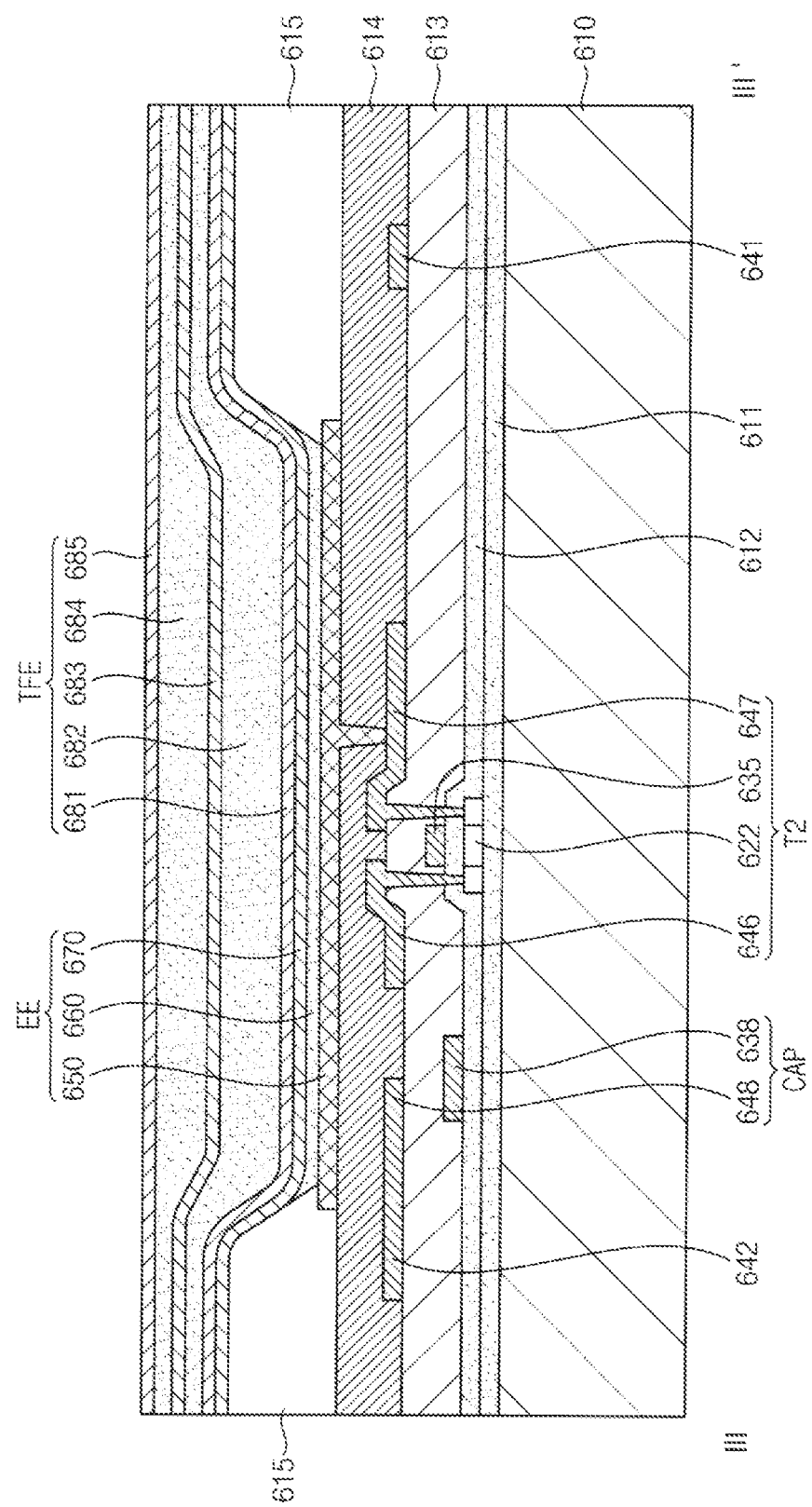
FIG. 5 is a schematic cross-sectional view taken along line III-III' of FIG. 4.

FIG. 4 is a plan view schematically illustrating a display panel included in the flexible display module of FIG. 3. FIG. 5 is a schematic cross-sectional view taken along line of FIG. 4.

Referring to FIG. 4 and FIG. 5, the display panel 600 may include pixels including a switching transistor T1, a driving transistor T2, a capacitor CAP, and an emission element (or light-emitting element or light-emitting diode) EE. In this case, the pixel means a minimum unit for displaying an image.

FIG. 4 and FIG. 5 illustrate that two transistors and one capacitor are disposed in one pixel, but the disclosure is not limited thereto. For example, a pixel includes three or more transistors and/or two or more capacitors.

The display panel 600 may include a substrate 610, a gate line 631 disposed on the substrate 610, a data line 641 intersecting the gate line 631 and insulated from the gate line 631, and common line 642. In general, a pixel may be defined as a boundary with the gate line 631, the data line 641, and the common line 642, but the pixel is not limited to the above definition. The pixel may be defined by a black matrix or a pixel defining layer.

The substrate 610 may include flexible material such as plastic. For example, the substrate 610 may be formed of polyethersulfone, polycarbonate, polyimide, polyethylene terephthalate, polyethylene naphthalate, polyacrylate, fiber reinforced plastic, etc.

A thickness of the substrate 610 may be about 5 μm or greater and about 200 μm or less. In case that the thickness of the substrate 610 is less than about 5 the emission element EE may not be stably supported by the substrate 610. In case that the thickness of the substrate 610 is greater than about 200 flexibility of the substrate 610 may deteriorate.

A buffer layer 611 may be disposed on the substrate 610. The buffer layer 611 may prevent penetration of impurities, and an upper surface of the buffer layer may be substantially flat. The buffer layer 611 may be formed of silicon nitride, silicon oxide, silicon oxynitride, etc. The buffer layer 611 is not necessarily required, and may be omitted depending on type and process conditions of the substrate 610.

A switching semiconductor layer 621 and a driving semiconductor layer 622 may be disposed on the buffer layer 611. The switching semiconductor layer 621 and the driving semiconductor layer 622 may be formed of any one of polycrystalline silicon, amorphous silicon, and oxide semiconductors such as indium gallium zinc oxide (IGZO) and indium zinc tin oxide (IZTO). For example, in case that the driving semiconductor layer 622 is formed of polycrystalline silicon, the driving semiconductor layer 622 may include a channel region that is not doped with impurities, and a source region and a drain region formed by doping impurities in both sides of the channel region. In this case, the impurities may be a p type dopant such as boron, and $B_2H_6$ may be mainly used. The impurities may vary depending on the type of transistor. In the disclosure, a PMOS transistor using a p type dopant is used as the driving transistor T2, but the driving transistor T2 is not limited thereto, and the driving transistor T2 may be a NMOS transistor or a CMOS transistor.

A gate insulating layer 612 may be disposed on the switching semiconductor layer 621 and the driving semiconductor layer 622. The gate insulating layer 612 may be formed of (or include) tetraethoxysilane, silicon nitride, silicon oxide, etc.

A gate pattern including gate electrodes 632 and 635 may be disposed on the gate insulating layer 612. The gate pattern may further include the gate line 631, and a first capacitor electrode 638. The gate electrodes 632 and 635 may be disposed to overlap at least a portion (for example, a channel region) of the semiconductor layers 621 and 622. The gate electrodes 632 and 635 may block doping of impurities in the channel region when the source and the drain region of the semiconductor layers 621 and 622 are doped during formation of the semiconductor layers 621 and 622.

The gate electrodes 632 and 635 and the first capacitor electrode 638 may be disposed on the same layer and may be formed of substantially same metal(s). For example, the gate electrodes 632 and 635 and the first capacitor electrode 638 may be formed of molybdenum, chromium, tungsten, etc.

An interlayer insulating layer 613 covering (or overlapping) the gate electrodes 632 and 635 may be disposed on the gate insulating layer 612. The interlayer insulating layer 613 may be formed of tetraethoxysilane, silicon nitride, silicon oxide, etc. However, a material of the interlayer insulating layer 613 is not limited thereto.

A data pattern including source electrodes 643 and 646 and drain electrodes 644 and 647 may be disposed on the interlayer insulating layer 613. The data pattern may further include the data line 641, the common line 642, and a second capacitor electrode 648. The source electrodes 643 and 646 and the drain electrodes 644 and 647 may be electrically connected to the source and drain regions of the semiconductor layers 621 and 622 through contact holes formed in the gate insulating layer 612 and the interlayer insulating layer 613 respectively.

The switching transistor T1 may include the switching semiconductor layer 621, the switching gate electrode 632, the switching source electrode 643, and the switching drain electrode 644, and the driving transistor T2 may include the driving semiconductor layer 622, the driving gate electrode 635, the driving source electrode 646, and the driving drain electrode 647. The capacitor CAP may include a first capacitor electrode 638 and a second capacitor electrode 648. In this case, the interlayer insulating layer 613 may be disposed between the first capacitor electrode 638 and the second capacitor electrode 648.

The switching transistor T1 may be used as a switching element for selecting a pixel to emit light. The switching transistor T1 may be electrically connected to the gate line 631. The switching source electrode 643 may be electrically connected to the data line 641. The switching drain electrode 644 may be apart from the switching source electrode 643 and may be electrically connected to the first capacitor electrode 638.

The driving transistor T2 may apply driving power to a pixel electrode 650 to emit light for an emission layer 660 of the emission element EE in a selected pixel. The driving gate electrode 635 may be electrically connected to the first capacitor electrode 638. Each of the driving source electrode 646 and the second capacitor electrode 648 may be electrically connected to the common line 642. The driving drain electrode 647 may be electrically connected to the pixel electrode 650 of the emission element EE through a contact hole.

The switching transistor T1 may be operated by a gate voltage applied to the gate line 631 and may transfer a data voltage applied to the data line 641 to the driving transistor T2. A voltage corresponding to the difference between a common voltage applied from the common line 642 to the driving transistor T2 and the data voltage transmitted from the switching transistor T1 may be stored in the capacitor CAP, and a current corresponding to the voltage stored in the capacitor CAP may be transmitted to the emission element EE through the driving transistor T2, and the emission element EE may emit light.

A planarization layer 614 covering or overlapping the data pattern including the data line 641, the common line 642, the source electrodes 643 and 646, the drain electrodes 644 and 647, and the second capacitor electrode 648 may be disposed on the interlayer insulating layer 613.

The planarization layer 614 may remove a step (or height difference) in order to increase a luminous efficiency of the emission element EE. The planarization layer 614 may be formed of polyacrylate resin, epoxy resin, phenolic resin, polyamide resin, polyimide resin, unsaturated polyester resin, polyphenylene resin, polyphenylene sulfide resin, benzocyclobutene, etc.

The pixel electrode 650 of the emission element EE may be disposed on the planarization layer 614. The pixel electrode 650 may be electrically connected to the drain electrode 647 through a contact hole formed in the planarization layer 614.

A pixel defining layer 615 that defines a pixel area by exposing at least a portion of the pixel electrode 650 may be disposed on the planarization layer 614. The pixel electrode 650 may be disposed to correspond to a pixel area of the pixel defining layer 615. The pixel defining layer 615 may be formed of polyacrylate resin, polyimide resin, etc.

The emission layer 660 may be disposed on the pixel electrode 650 in the pixel area, and a common electrode 670 may be disposed on the pixel defining layer 615 and the emission layer 660. The emission layer 660 may be formed of a low molecular weight organic material or a high molecular weight organic material. At least one of a hole injection layer (HIL) and a hole transport layer (HTL) may be further disposed between the pixel electrode 650 and the emission layer 660, and at least one of an electron transport layer (ETL) and an electron injection layer (EIL) may be further disposed between the emission layer 660 and the common electrode 670.

Each of the pixel electrode 650 and the common electrode 670 may be formed of any one of a transparent electrode, a transflective electrode, and a reflective electrode.

An encapsulation layer TFE may be disposed on the common electrode 670. The encapsulation layer TFE may include one or more inorganic layers 681, 683, and 685 and one or more organic layers 682 and 684. In addition, the encapsulation layer TFE may have a structure in which the inorganic layers 681, 683, and 685 and the organic layers 682 and 684 are alternately stacked. In this case, the inorganic layer 681 may be disposed at a lower surface of the encapsulation layer TFE. In other words, the inorganic layer 681 may be disposed closest to the emission element EE.

FIG. 5 illustrates that the encapsulation layer TFE includes three inorganic layers 681, 683, and 685 and two organic layers 682 and 684, but the disclosure is not limited thereto.

A thickness of the encapsulation layer TFE may be about 10 μm or less. Accordingly, a thickness of the display panel 600 may be very thin. As the encapsulation layer TFE is disposed on the emission element EE, a flexible characteristic of the display panel 600 may be maximized.

Figure 6:
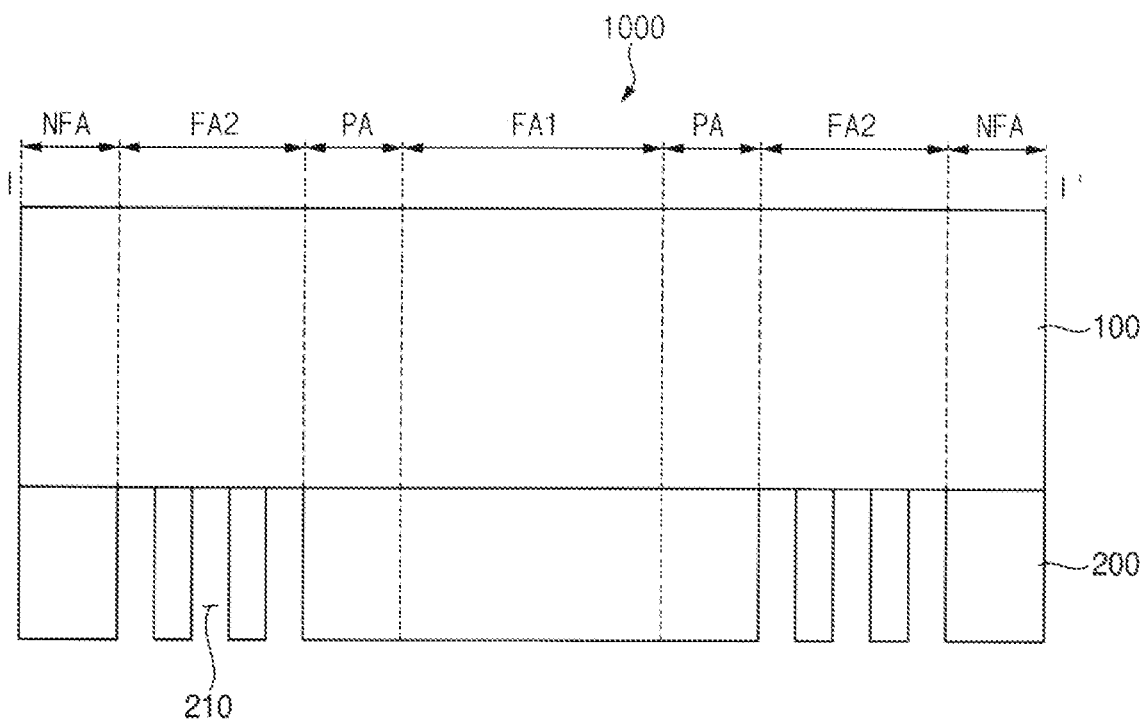
FIG. 6 is a cross-sectional view schematically illustrating a foldable display device according to another embodiment.
Figure 7:
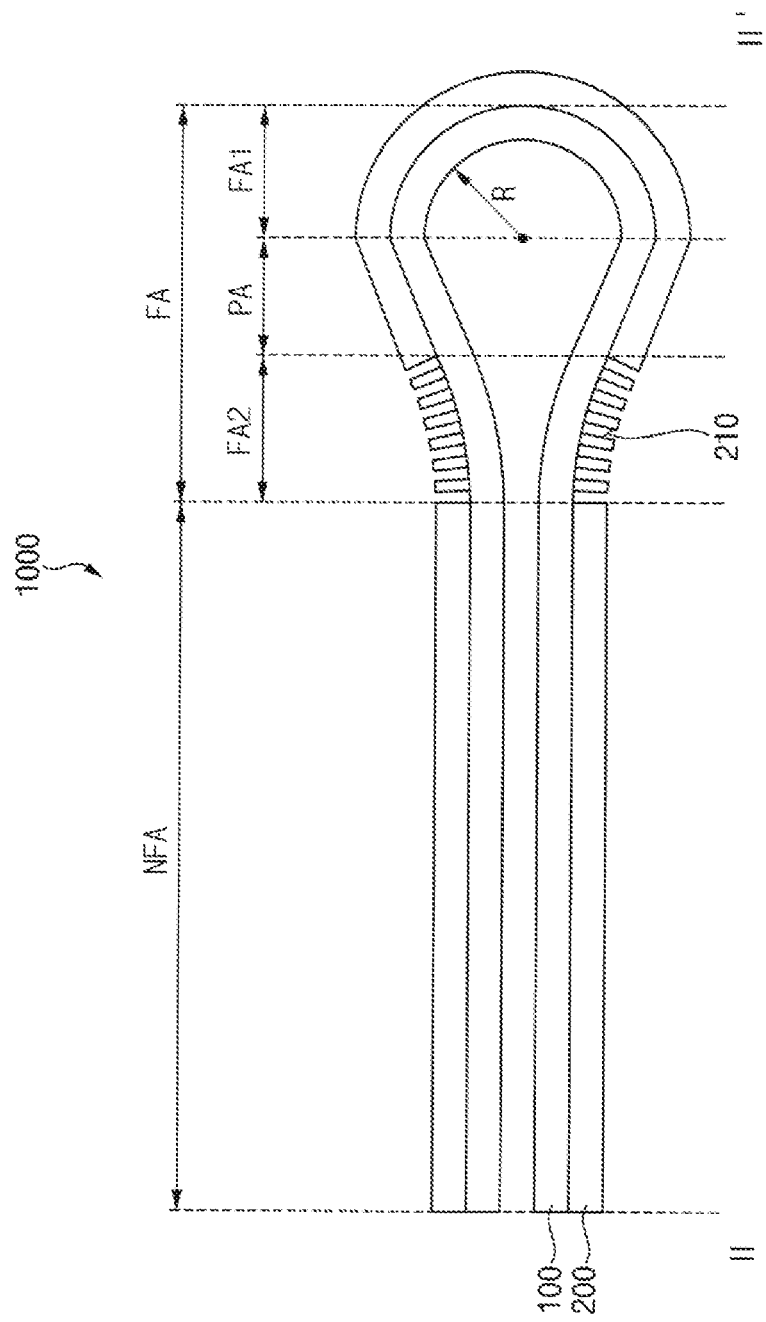
FIG. 7 is a cross-sectional view schematically illustrating a folded state of the foldable display device of FIG. 6.

FIG. 6 is a cross-sectional view schematically illustrating a foldable display device according to another embodiment. FIG. 7 is a cross-sectional view schematically illustrating a folded state of the foldable display device of FIG. 6.

Referring to FIG. 6 and FIG. 7, a first plate 200 may be disposed under a flexible display module 100. The flexible display module 100 may be substantially identical or similar to the flexible display module 100 described with reference to FIGS. 1 to 5. The first plate 200 may be different from the first plate 200 described with reference to FIGS. 1 to 5 at least in a groove 210. For example, FIG. 6 may be a schematic cross-sectional view taken along line I-I' of FIG. 1, and FIG. 7 may be a schematic cross-sectional view taken along line II-II' of FIG. 2.

The first plate 200 may include grooves 210 overlapping the second area FA2 and penetrating the first plate 200. The grooves 210 may relatively reduce repulsive force of the first plate 200 overlapping the second area FA2. Accordingly, in case that the foldable display device 1000 is folded and then unfolded, the crease may not occur in the second area FA2 or a depth of the crease may be relatively small.

Figure 8:
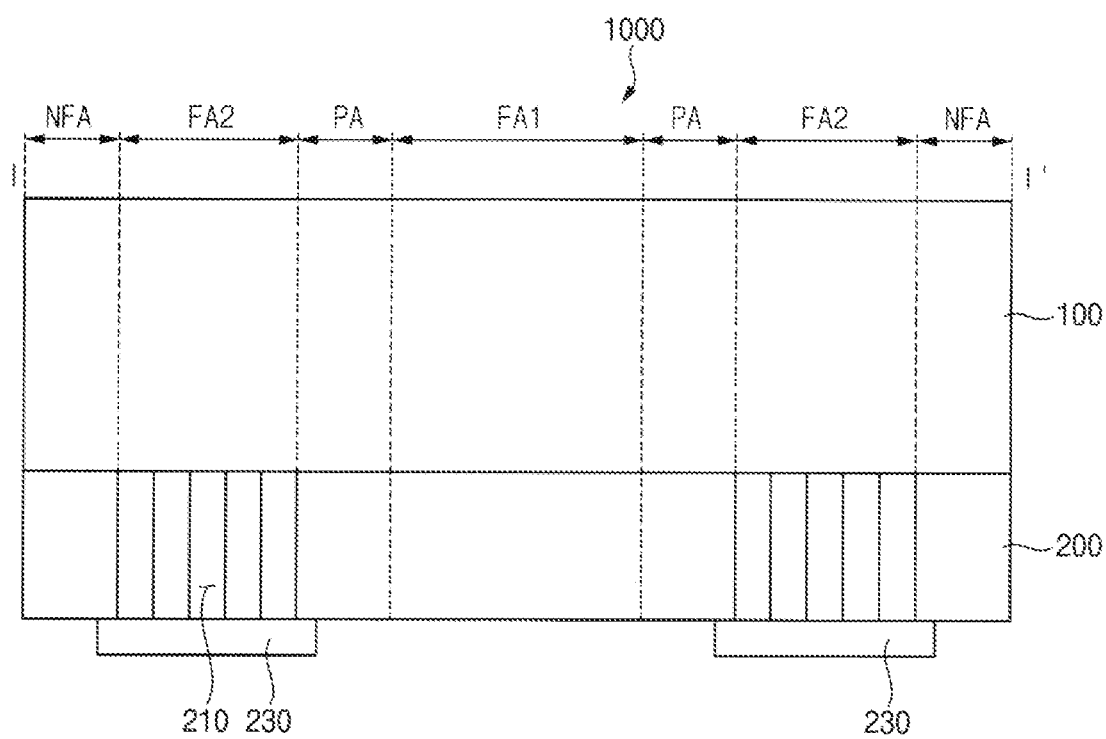
FIGS. 8, 9, and 10 are cross-sectional views schematically illustrating other embodiments of the foldable display device of FIG. 6.

FIG. 8 is a cross-sectional view schematically illustrating other embodiment of the foldable display device of FIG. 6. A description overlapping with that of the foldable display device of FIG. 6 will be omitted.

Referring to FIG. 8, the foldable display device 1000 may further include a protection layer 230 disposed under the first plate 200 and overlapping the second area FA2. A part of the protection layer 230 may also overlap a part of the third area PA adjacent to the second area FA2. Another part of the protection layer 230 may also overlap a part of the non-foldable area NFA adjacent to the second area FA2. The protection layer 230 may prevent external impurities from penetrating into the lower surface of the flexible display module 100 through the groove 210 penetrating the first plate 200. The protection layer 230 may include an elastomer having a relatively large elastic force or a relatively large restoring force. For example, the protective layer 230 may include an elastic material such as silicon, urethane, thermoplastic polyurethane, nylon, etc.

Figure 9:
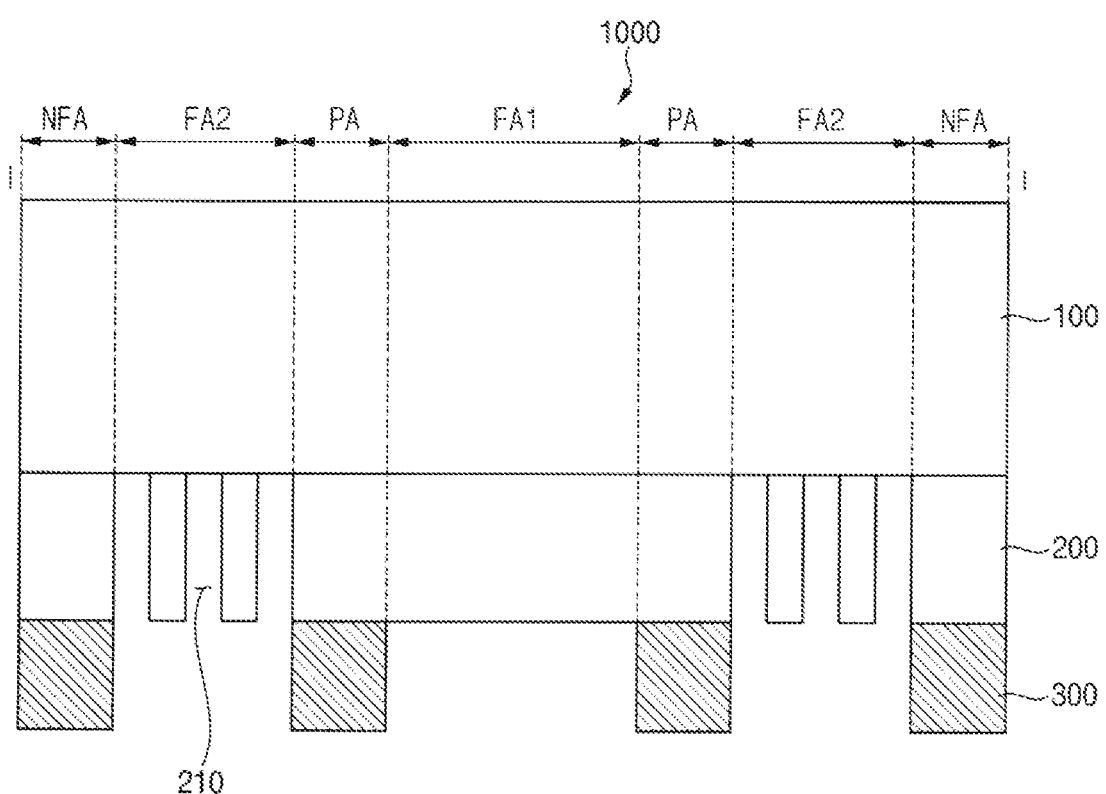
Figure 10:
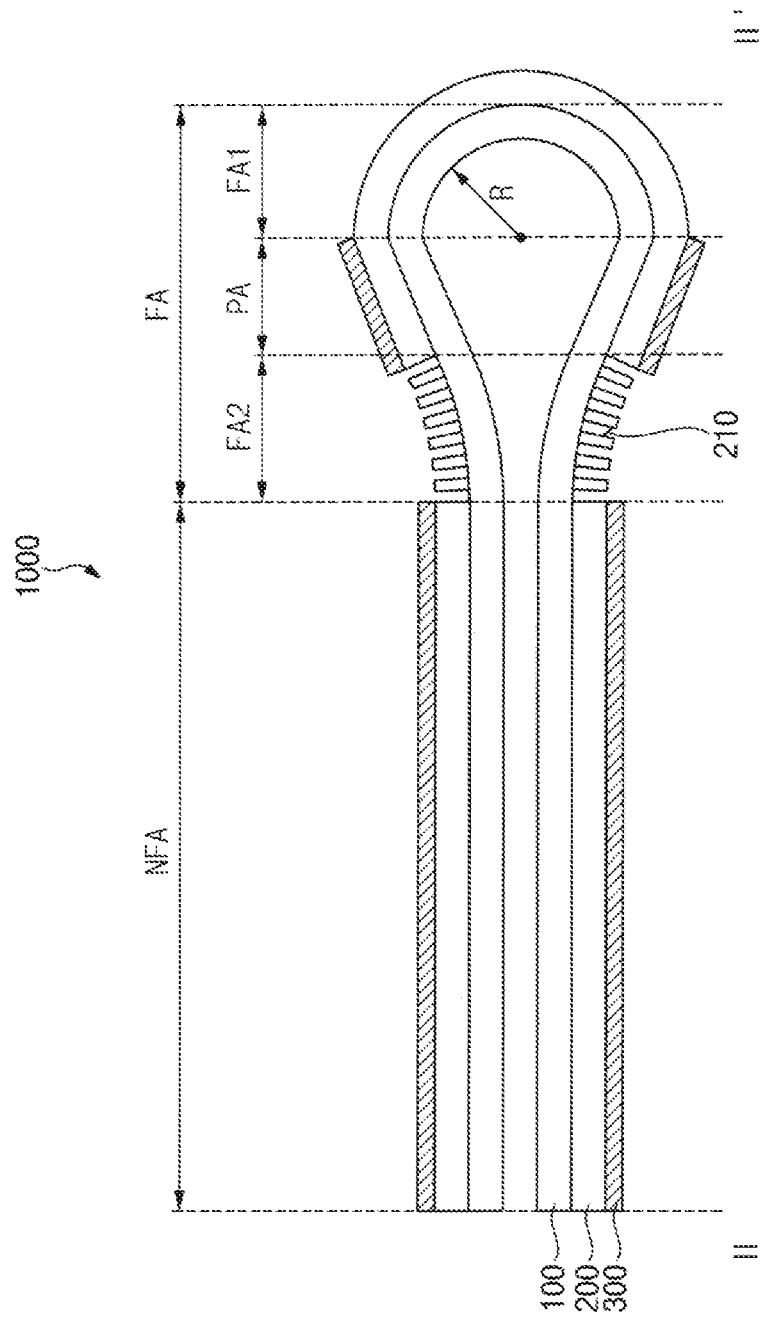

FIG. 9 is a cross-sectional view schematically illustrating other embodiment of the foldable display device of FIG. 6. FIG. 10 is a cross-sectional view schematically illustrating a folded state of the foldable display device of FIG. 9. A description overlapping with that of the foldable display device of FIG. 6 will be omitted.

Referring to FIG. 9 and FIG. 10, a second plate 300 may be disposed under the first plate 200. The second plate 300 may overlap each of the non-foldable area NFA and the third area PA. The second plate 300 may not be folded or bent. The second plate 300 may support the first plate 200 overlapping the non-foldable area NFA and the third area PA. A rigidity of the second plate 300 may be greater than a rigidity of the first plate 200.

Figure 11:
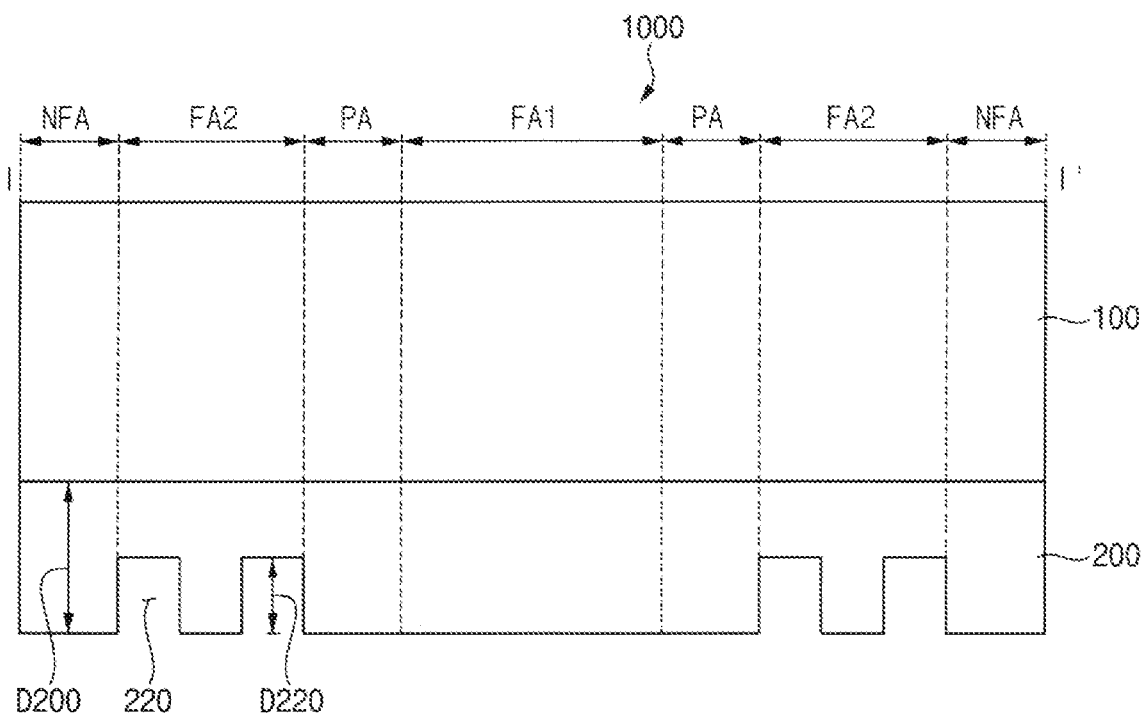
FIG. 11 is a cross-sectional view schematically illustrating a foldable display device according to still another embodiment of the disclosure.
Figure 12:
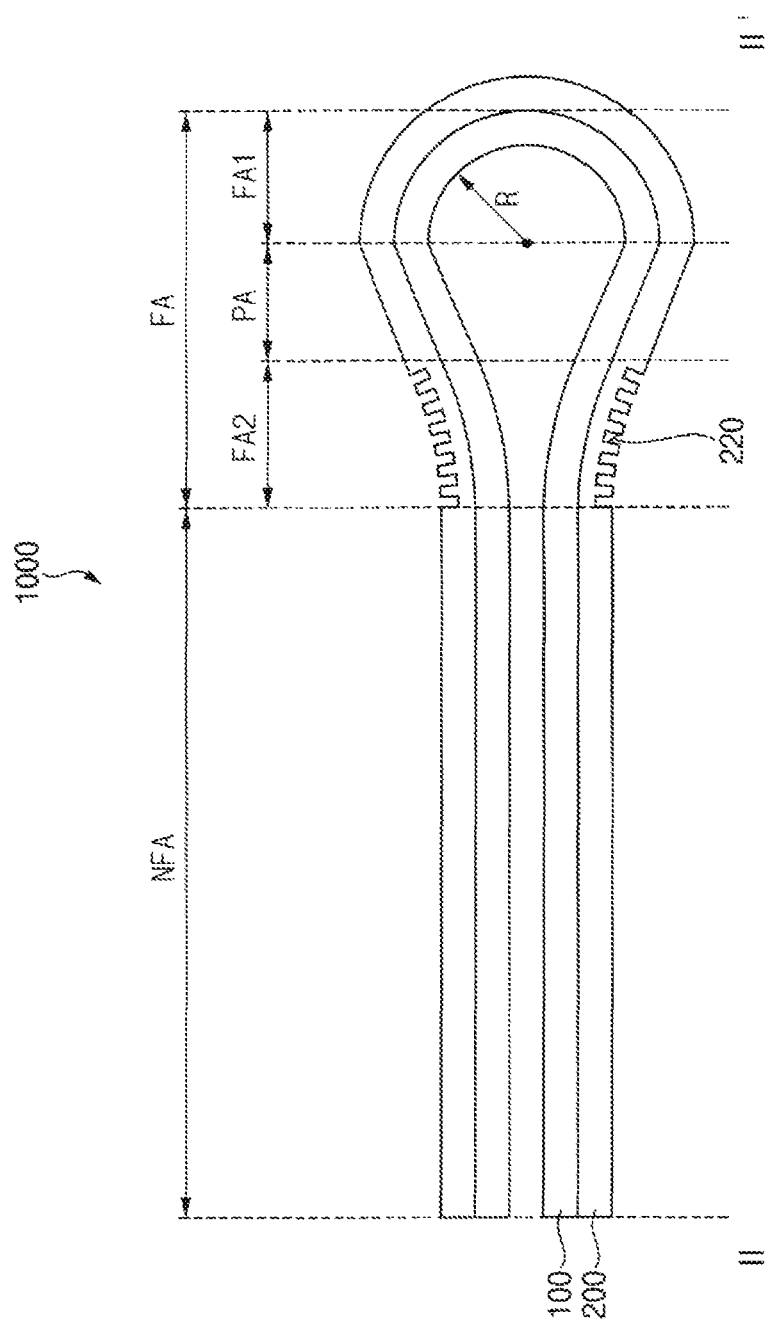
FIG. 12 is a cross-sectional view schematically illustrating a folded state of the foldable display device of FIG. 11.

FIG. 11 is a cross-sectional view schematically illustrating a foldable display device according to still another embodiment of the disclosure. FIG. 12 is a cross-sectional view schematically illustrating a folded state of the foldable display device of FIG. 11.

Referring to FIG. 11 and FIG. 12, a first plate 200 may be disposed under the flexible display module 100. The flexible display module 100 may be substantially identical or similar to the flexible display module 100 described with reference to FIGS. 1 to 5. The first plate 200 may be different from the first plate 200 described with reference to FIGS. 1 to 5 at least in a groove 220. For example, FIG. 11 may be a schematic cross-sectional view taken along line I-I' of FIG. 1, and FIG. 12 may be a schematic cross-sectional view taken along line II-II' of FIG. 2.

The first plate 200 may include grooves 220 overlapping the second area FA2 and not penetrating the first plate 200. The grooves 220 may relatively reduce repulsive force of the first plate 200 overlapping the second area FA2. Accordingly, in case that the foldable display device 1000 is folded and then unfolded, the crease may not occur in the second area FA2 or a depth of the crease may be relatively small. A depth D220 of the grooves 220 not penetrating the first plate 200 compared to a thickness D200 of the first plate 200 may be about 40% or greater and about 60% or less.

Figure 13:
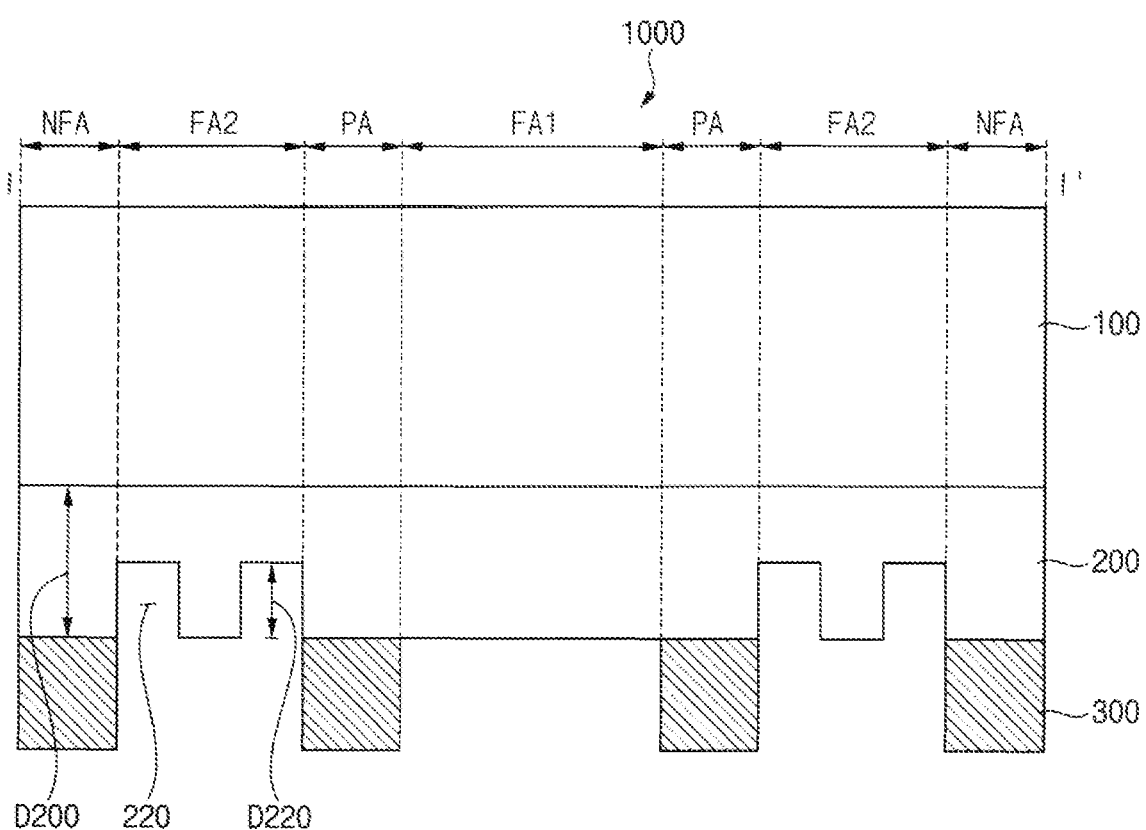
FIGS. 13, and 14 are cross-sectional views schematically illustrating other embodiments of the foldable display device of FIG. 11.
Figure 14:
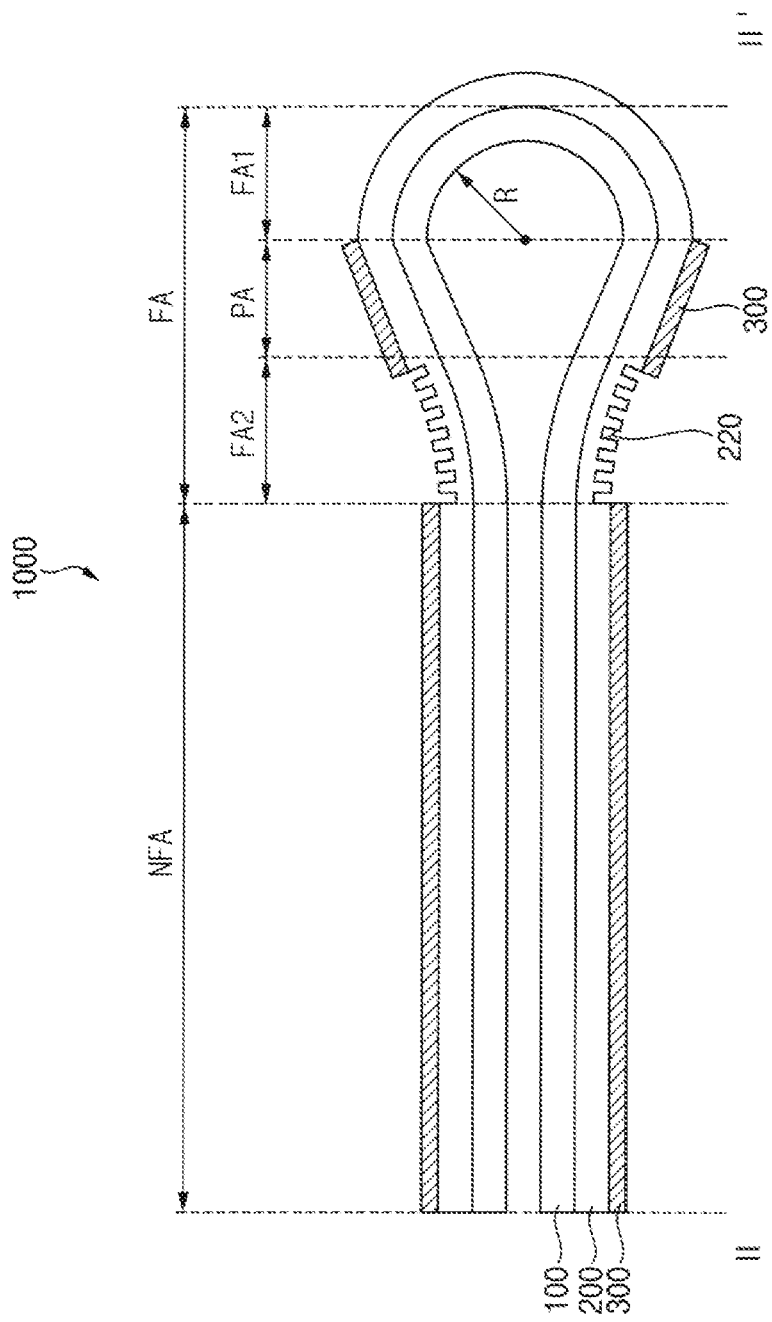

FIG. 13 is a cross-sectional view schematically illustrating other embodiment of the foldable display device of FIG. 11. FIG. 14 is a cross-sectional view schematically illustrating a folded state of the foldable display device of FIG. 13. A description overlapping with that of the foldable display device of FIG. 11 will be omitted.

Referring to FIG. 13 and FIG. 14, a second plate 300 may be disposed under the first plate 200. The second plate 300 may overlap the non-foldable area NFA and the third area PA. The second plate 300 may not be folded or bent. The second plate 300 may support the first plate 200 overlapping the non-foldable area NFA and the third area PA. A rigidity of the second plate 300 may be greater than a rigidity of the first plate 200.

Figure 15:
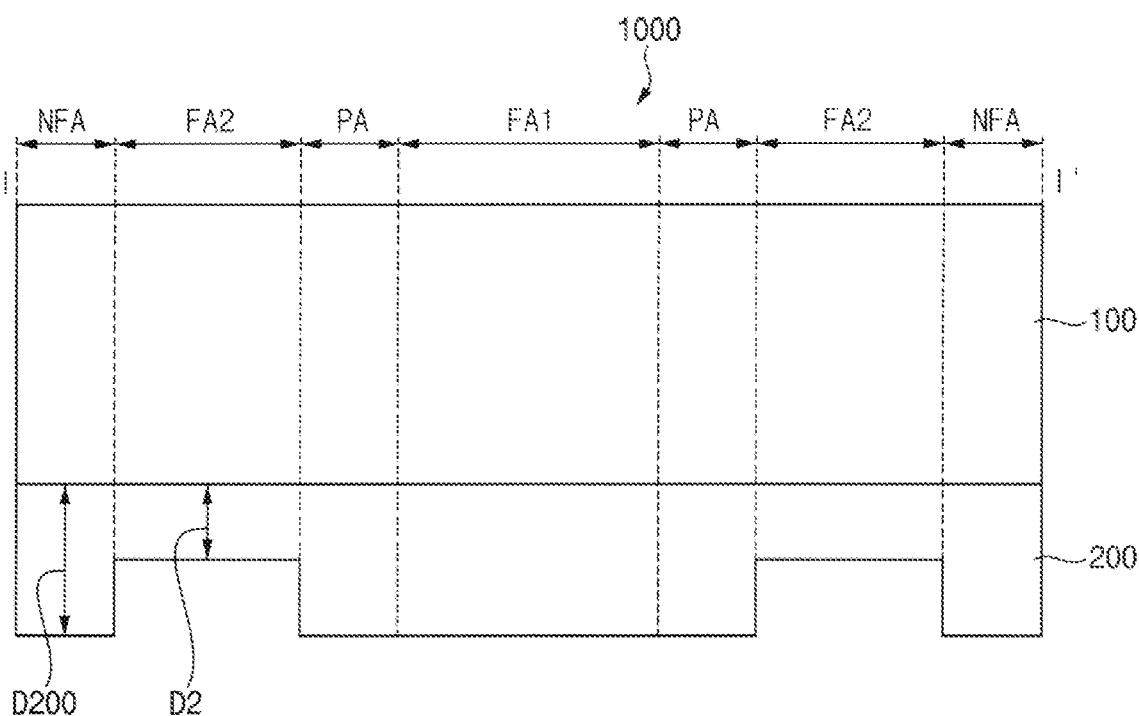
FIG. 15 is a cross-sectional view schematically illustrating a foldable display device according to further still another embodiment of the disclosure.
Figure 16:
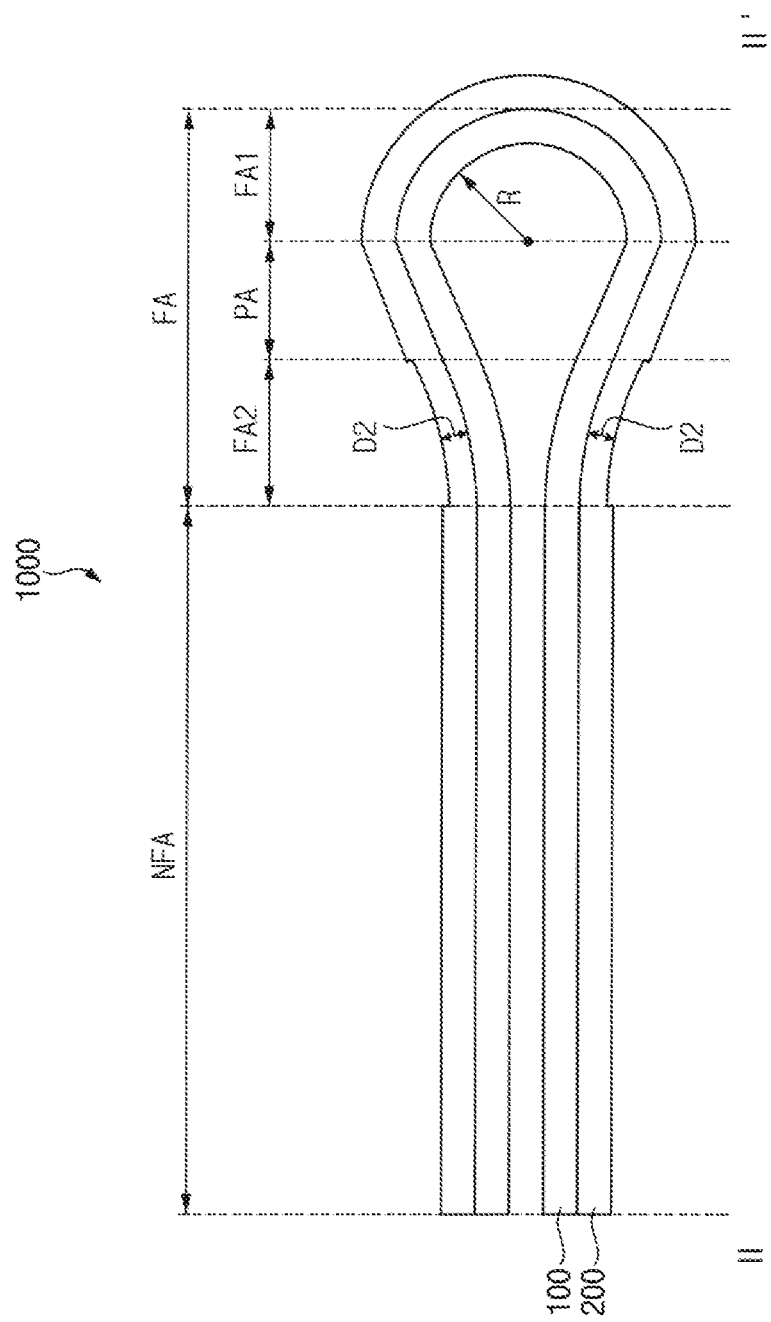
FIG. 16 is a cross-sectional view schematically illustrating a folded state of the foldable display device of FIG. 15.

FIG. 15 is a cross-sectional view schematically illustrating a foldable display device according to further still another embodiment of the disclosure. FIG. 16 is a cross-sectional view schematically illustrating a folded state of the foldable display device of FIG. 15.

Referring to FIG. 15 and FIG. 16, a first plate 200 may be disposed under a flexible display module 100. The flexible display module 100 may be substantially identical or similar to the flexible display module 100 described with reference to FIGS. 1 to 5. The first plate 200 may be substantially different from the first plate 200 described with reference to FIGS. 1 to 5 at least in a thickness D2 of the first plate 200 overlapping the second area FA2. For example, FIG. 15 may be a schematic cross-sectional view taken along line I-I' of FIG. 1, and FIG. 16 may be a schematic cross-sectional view taken along line II-II' of FIG. 2.

The thickness D2 of the first plate 200 overlapping the second area FA2 may be less than a thickness D200 of the first plate 200 overlapping the non-foldable area NFA. Accordingly, repulsive force of the first plate 200 overlapping the second area FA2 may be relatively reduced. So, in case that the foldable display device 1000 is folded and then unfolded, the crease may not occur in the second area FA2 or a depth of the crease may be relatively small.

In an embodiment, the thickness D2 of the first plate 200 overlapping the second area FA2 compared to the thickness D200 of the first plate 200 overlapping the non-foldable area NFA may be about 50% or greater. In case that the thickness D2 of the first plate 200 overlapping the second area FA2 compared to the thickness D200 of the first plate 200 overlapping the non-foldable area NFA is less than about 50%, the flexible display module 100 may not be stably supported by the first plate 200 overlapping the second area FA2.

Figure 17:
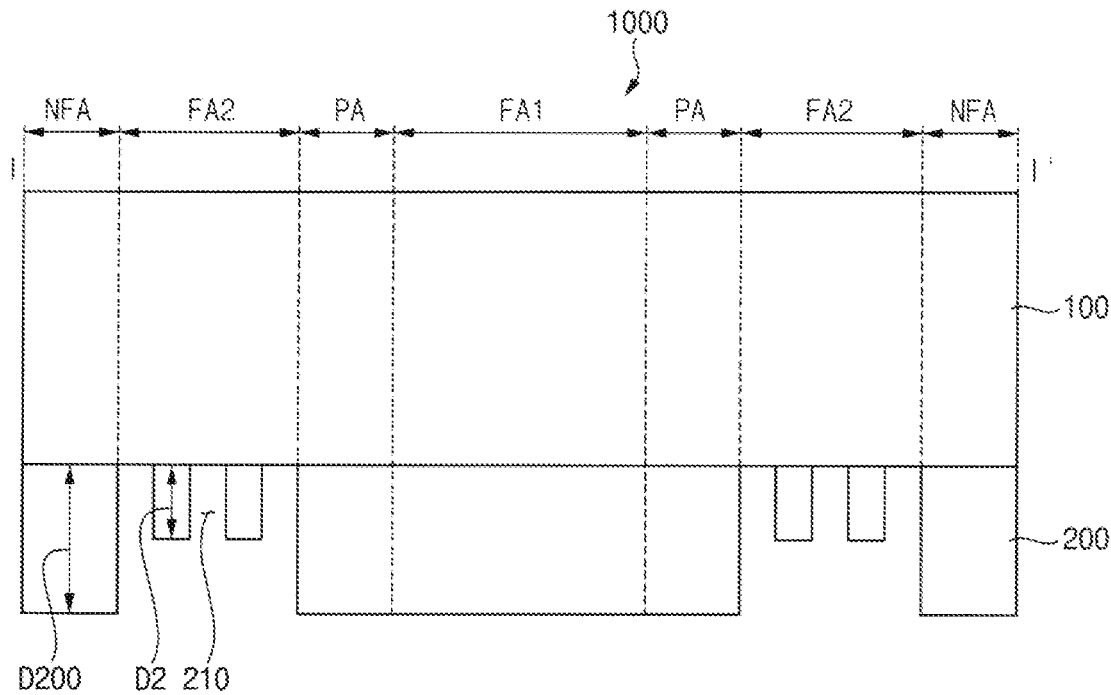
FIGS. 17, 18, 19, 20, and 21 are cross-sectional views schematically illustrating other embodiments of the foldable display device of FIG. 15.

FIG. 17 is a cross-sectional view schematically illustrating other embodiment of the foldable display device of FIG. 15. A description overlapping with that of the foldable display device of FIG. 15 will be omitted.

Referring to FIG. 17, the thickness D2 of the first plate 200 overlapping the second area FA2 may be less than the thickness D200 of the first plate 200 overlapping the non-foldable area NFA. The first plate 200 may include grooves 210 overlapping the second area FA2 and penetrating the first plate 200.

The grooves 210 overlapping the second area FA2 may relatively reduce repulsive force of the first plate 200 overlapping the second area FA2. Accordingly, in case that the foldable display device 1000 is folded and then unfolded, the crease may not occur in the second area FA2 or a depth of the crease may be relatively small.

Figure 18:
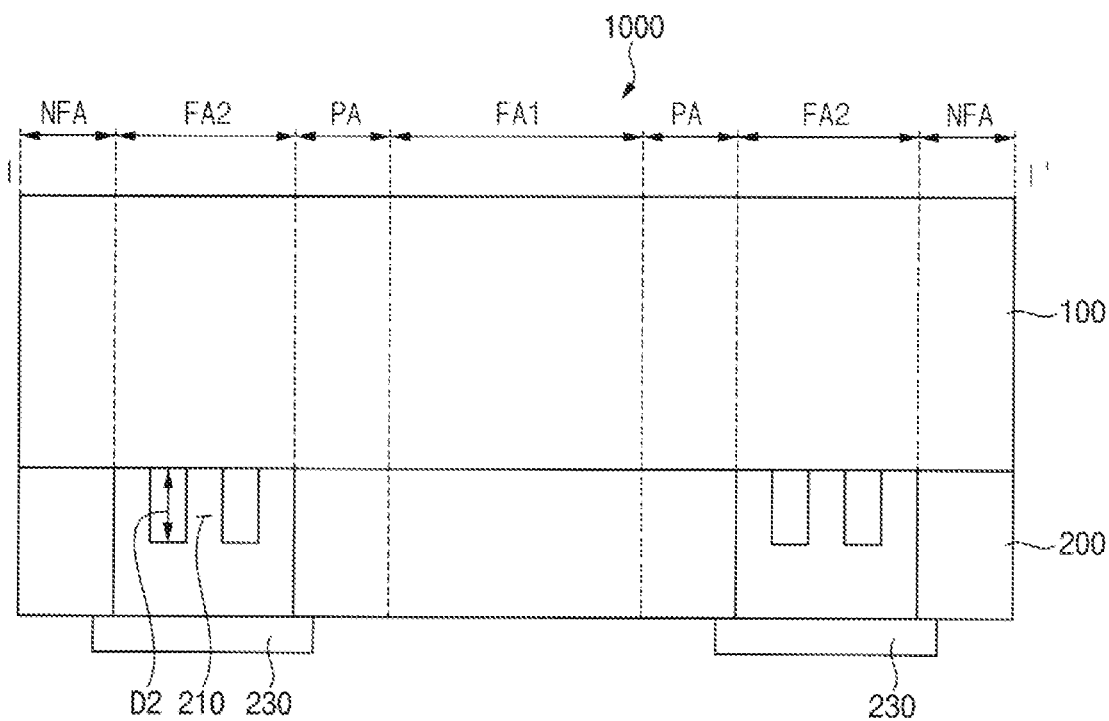

FIG. 18 is a cross-sectional view schematically illustrating other embodiment of the foldable display device of FIG. 17. A description overlapping that of the foldable display device of FIG. 17 will be omitted.

Referring to FIG. 18, the foldable display device 1000 may further include a protection layer 230 disposed under the first plate 200 and overlapping the second area FA2. A part of the protection layer 230 may also overlap a part of the third are PA adjacent to the second area FA2. Another part of the protection layer 230 may also overlap a part of the non-foldable area NFA adjacent to the second area FA2. The protection layer 230 may prevent external impurities from penetrating into a lower surface of the flexible display module 100 through the groove 210 penetrating the first plate 200. The protective layer 230 may include an elastomer having a relatively large elastic force or a relatively large restoring force. For example, the protective layer 230 may include an elastic material such as silicon, urethane, thermoplastic polyurethane, nylon, etc.

Figure 19:
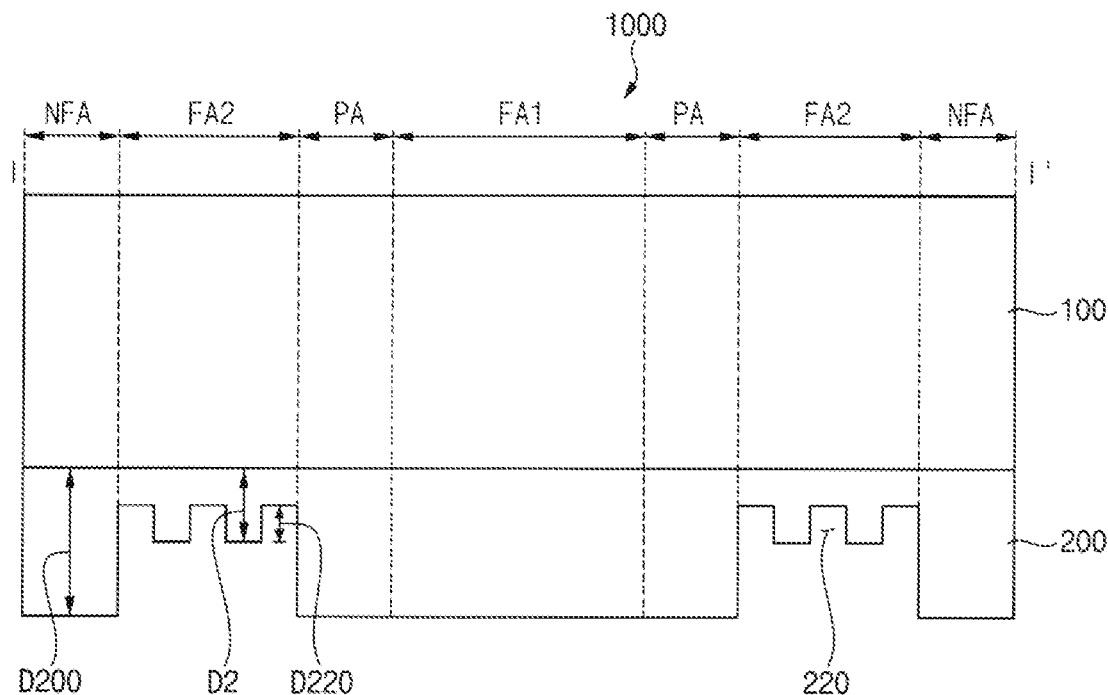

FIG. 19 is a cross-sectional view schematically illustrating other embodiment of the foldable display device of FIG. 15. A description overlapping with that of the foldable display device of FIG. 15 will be omitted.

Referring to FIG. 19, the thickness D2 of the first plate 200 overlapping the second area FA2 may be less than the thickness D200 of the first plate 200 overlapping the non-folded area NFA. The first plate 200 may include grooves 220 overlapping the second area FA2 and not penetrating the first plate 200. A depth D220 of the plurality of grooves 220 not penetrating the first plate 200 compared to the thickness D200 of the first plate 200 may be about 40% or greater and about 60% or less.

The grooves 220 overlapping the second area FA2 may relatively reduce repulsive force of the first plate 200 overlapping the second area FA2. Accordingly, in case that the foldable display device 1000 is folded and then unfolded, the crease may not occur in the second area FA2 or a depth of the crease may be relatively small.

Figure 20:
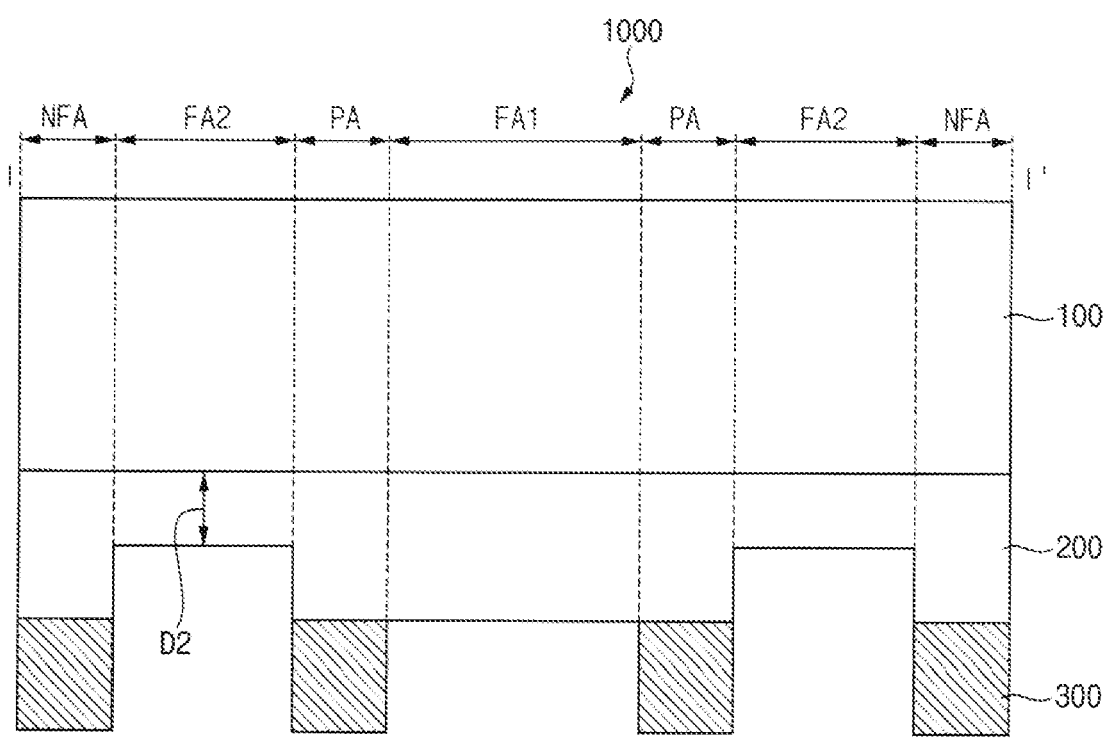
Figure 21:
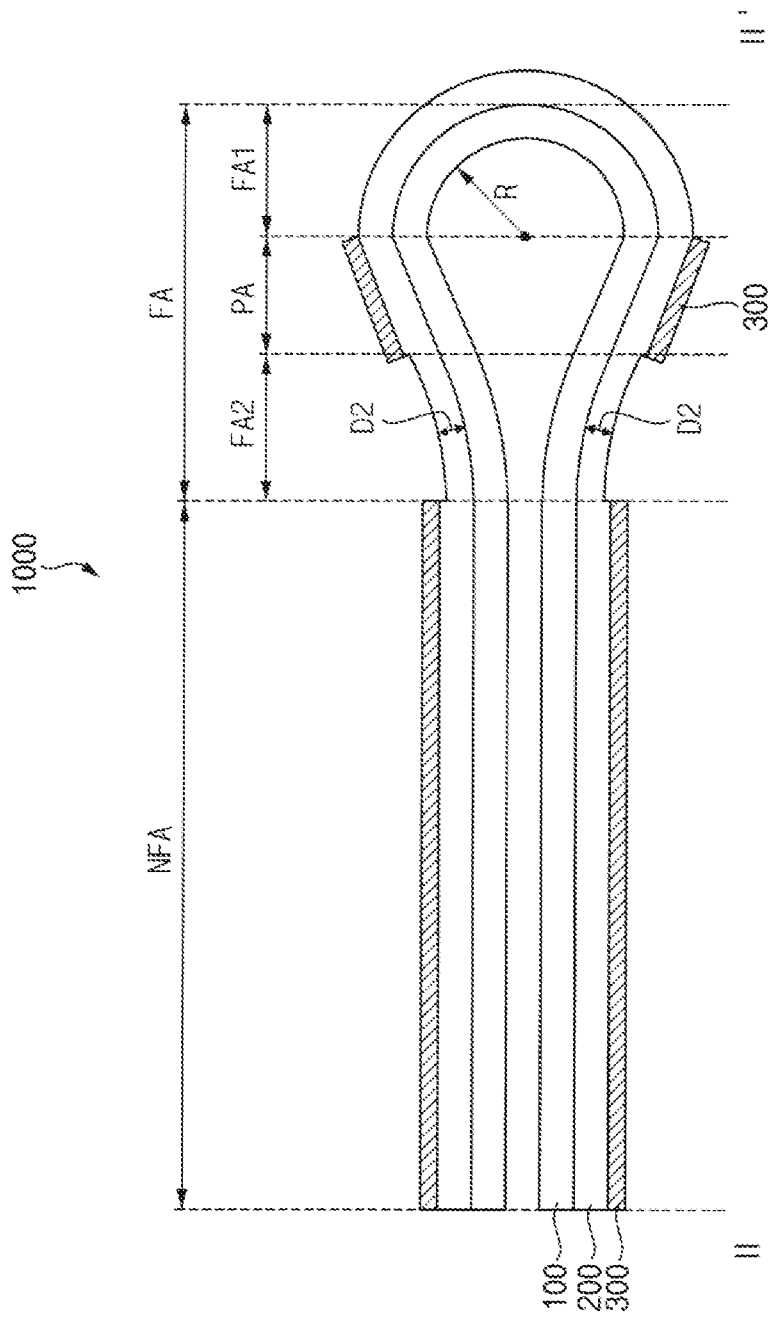

FIG. 20 is a cross-sectional view schematically illustrating other embodiment of the foldable display device of FIG. 15. FIG. 21 is a cross-sectional view schematically illustrating a folded state of the foldable display device of FIG. 20. A description overlapping with that of the foldable display device of FIG. 15 will be omitted.

Referring to FIG. 20 and FIG. 21, a second plate 300 may be disposed under the first plate 200. The second plate 300 may overlap the non-foldable area NFA and the third area PA. The second plate 300 may not be folded or bent. The second plate 300 may support the first plate 200 overlapping the non-foldable area NFA and the third area PA. A rigidity of the second plate 300 may be greater than a rigidity of the first plate 200.

The disclosure may be applicable to numerous display devices such as smartphones, smart pads, PMP, PDA, MP3 players, etc.

It should be understood that embodiments described herein should be considered in a descriptive sense only not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope.

What is claimed is:

1. A foldable display device comprising:
   a flexible display module comprising:
      a foldable area comprising:
         a first area;
         a second area spaced apart from the first area and disposed in at least two sides of the first area; and
         a third area disposed between the first area and the second area; and
      a non-foldable area disposed in at least two sides of the foldable area; and
   a first plate disposed under the flexible display module, wherein
   the first plate comprises a plurality of grooves overlapping the second area and penetrating the first plate,
   the first plate overlapping the first area does not comprise grooves, and
   the first plate overlapping the third area does not comprise grooves.

2. The foldable display device of claim 1, wherein in case that the flexible display module is folded,
   the flexible display module has a first curvature radius in the first area, and has a second curvature radius in the second area, and
   the second curvature radius is greater than the first curvature radius.

3. The foldable display device of claim 1, wherein in case that the flexible display module is folded,
   a curvature center of the flexible display module in the second area is disposed on a non-display surface of the flexible display module, and
   a curvature center of the flexible display module in the first area is disposed on a display surface of the flexible display module.

4. The foldable display device of claim 1, further comprising:
   a protection layer disposed under the first plate and overlapping the second area.

5. The foldable display device of claim 1, further comprising:
   a second plate disposed under the first plate and overlapping each of the non-foldable area and the third area.

6. The foldable display device of claim 5, wherein a rigidity of the second plate is greater than a rigidity of the first plate.

7. A foldable display device comprising:
   a flexible display module comprising:
      a foldable area comprising:
         a first area;
         a second area spaced apart from the first area and disposed in at least two sides of the first area; and
         a third area disposed between the first area and the second area; and
      a non-foldable area disposed in at least two sides of the foldable area; and
   a first plate disposed under the flexible display module, wherein
   the first plate comprises a plurality of grooves overlapping the second area and not penetrating the first plate,
   the first plate overlapping the first area does not comprise grooves, and
   the first plate overlapping the third area does not comprise grooves.

8. The foldable display device of claim 7, wherein in case that the foldable display device is folded,
   the flexible display module has a first curvature radius in the first area and has a second curvature radius in the second area, and
   the second curvature radius is greater than the first curvature radius.

9. The foldable display device of claim 7, wherein a thickness of each of the plurality of grooves not penetrating the first plate compared to a thickness of the first plate is about 40% or greater and about 60% or less.

10. The foldable display device of claim 7, further comprising:
    a second plate disposed under the first plate and overlapping each of the non-foldable area and the third area.

11. The foldable display device of claim 10, wherein a rigidity of the second plate is greater than a rigidity of the first plate.

12. A foldable display device comprising:
    a flexible display module comprising:
       a foldable area comprising:
          a first area; a second area spaced apart from the first area and disposed in at least two sides of the first area; and
          a third area disposed between the first area and the second area; and
       a non-foldable area disposed in at least two sides of the foldable area; and
    a first plate disposed under the flexible display module, wherein
    a thickness of the first plate overlapping the second area is less than a thickness of the first plate overlapping the non-foldable area, and
    the first plate overlapping the third area does not comprise grooves.

13. The foldable display device of claim 12, wherein in case that the flexible display module is folded,
    the flexible display module has a first curvature radius in the first area, and has a second curvature radius in the second area, and
    the second curvature radius is greater than the first curvature radius.

14. The foldable display device of claim 12, the thickness of the first plate overlapping the second area compared to the thickness of the first plate overlapping the non-foldable area is about 50% or greater.

15. The foldable display device of claim 12, wherein the first plate further comprises a plurality of grooves overlapping the second area and penetrating the first plate.

16. The foldable display device of claim 15, further comprising:
    a protection layer disposed under the first plate and overlapping the second area.

17. The foldable display device of claim 12, wherein the first plate further comprises a plurality of grooves overlapping the second area and not penetrating the first plate.

18. The foldable display device of claim 17, wherein a thickness of each of the plurality of grooves not penetrating the first plate compared to the thickness of the first plate overlapping the second area is about 40% or greater and about 60% or less.

19. The foldable display device of claim 12, further comprising a second plate disposed under the first plate and overlapping each of the non-foldable area and the third area.

20. The foldable display device of claim 19, wherein a rigidity of the second plate is greater than a rigidity of the first plate.

21. The flexible display module of claim 7, wherein a thickness of the first plate overlapping the second area is less than a thickness of the first plate overlapping the non-foldable area.

\* \* \* \* \*